(12) United States Patent
Pensala

(10) Patent No.: US 6,476,536 B1
(45) Date of Patent: Nov. 5, 2002

(54) METHOD OF TUNING BAW RESONATORS

(75) Inventor: Tuomas Pensala, Helsinki (FI)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 09/845,089

(22) Filed: Apr. 27, 2001

(51) Int. Cl.[7] .............................................. H01L 41/08
(52) U.S. Cl. ....................... 310/312; 310/365
(58) Field of Search ........................... 310/312, 313 R, 310/365

(56) References Cited

U.S. PATENT DOCUMENTS

| | | | | |
|---|---|---|---|---|
| 4,211,947 A | * | 7/1980 | Ikeno et al. ................. | 310/312 |
| 5,714,917 A | * | 2/1998 | Ella ............................ | 310/318 |
| 5,789,845 A | * | 8/1998 | Wadaka et al. ............. | 310/311 |
| 5,880,552 A | * | 3/1999 | McGill et al. .......... | 310/313 R |
| 6,081,171 A | | 6/2000 | Ella ............................ | 333/189 |
| 6,111,341 A | * | 8/2000 | Hirama ....................... | 310/312 |
| 6,307,447 B1 | * | 10/2001 | Barber et al. ............... | 29/25.35 |
| 2002/0014808 A1 | * | 2/2002 | Misu et al. .................. | 310/312 |

FOREIGN PATENT DOCUMENTS

| | | | | |
|---|---|---|---|---|
| WO | | 0106647 | 1/2001 | ............ H03H/9/17 |

* cited by examiner

Primary Examiner—Thomas M. Dougherty
(74) Attorney, Agent, or Firm—Ware, Fressola, Van der Sluys & Adolphson LLP

(57) ABSTRACT

A method of tuning a bulk acoustic wave device having a piezoelectric layer formed between a top electrode and a bottom electrode, wherein the top electrode has a frame-like structure at an edge portion for reducing spurious resonance in the electrical response of the device. The frame-like structure surrounds a center zone of the top electrode. In order to down-shift the resonance frequency of the device, a tuning layer is provided on the top electrode. In particular, the tuning layer is designed such that it covers at least the entire center zone in order to reduce the spurious resonance introduced by the tuning layer itself. Preferably, the tuning layer covers the center zone as well as the frame-like structure to further reduce the spurious resonance.

9 Claims, 16 Drawing Sheets

METHOD OF TUNING BAW RESONATORS

FIELD OF THE INVENTION

The present invention relates generally to bulk acoustic wave resonators and filters and, more particularly, to the tuning of such resonators and filters.

BACKGROUND OF THE INVENTION

It is known that a bulk acoustic-wave (BAW) device is, in general, comprised of a piezoelectric layer sandwiched between two electronically conductive layers that serve as electrodes. When a radio frequency (RF) signal is applied across the device, it produces a mechanical wave in the piezoelectric layer. The fundamental resonance occurs when the wavelength of the mechanical wave is about twice the thickness of the piezoelectric layer. Although the resonant frequency of a BAW device also depends on other factors, the thickness of the piezoelectric layer is the predominant factor in determining the resonant frequency. As the thickness of the piezoelectric layer is reduced, the resonance frequency is increased. BAW devices have traditionally been fabricated on sheets of quartz crystals. In general, it is difficult to achieve a device of high resonance frequency using this fabrication method. When fabricating BAW devices by depositing thin-film layers on passive substrate materials, one can extend the resonance frequency to the 0.5–10 GHz range. These types of BAW devices are commonly referred to as thin-film bulk acoustic resonators or FBARs. There are primarily two types of FBARs, namely, BAW resonators and stacked crystal filters (SCFs). An SCF usually has two or more piezoelectric layers and three or more electrodes, with some electrodes being grounded. The difference between these two types of devices lies mainly in their structure. FBARs are usually used in combination to produce passband or stopband filters. The combination of one series FBAR and one parallel, or shunt, FBAR makes up one section of the so-called ladder filter. The description of ladder filters can be found, for example, in Ella (U.S. Pat. No. 6,081,171). As disclosed in Ella, an FBAR-based device may have one or more protective layers commonly referred to as the passivation layers. A typical FBAR-based device is shown in FIGS. 1a and 1b. As shown in FIG. 1, the FBAR device comprises a substrate 110, a bottom electrode 120, a piezoelectric layer 130, and a top electrode 140. The FBAR device may additionally include a membrane layer 112 and a sacrificial layer 114, among others. The substrate can be made from silicon (Si), silicon dioxide (SiO2), Gallium Arsenide (GaAs), glass or ceramic materials. The bottom electrode and top electrode can be made from gold (Au), molybdenum (Mo), tungsten (W), copper (Cu), nickel (Ni), titanium (Ti), Niobium (Nb), silver (Ag), tantalum (Ta), cobalt (Co), or aluminum (Al). The piezoelectric layer 130 can be made from zinc oxide (ZnO), zinc sulfide (ZnS), aluminum nitride (AlN), lithium tantalate (LiTaO$_3$) or other members of the so-called lead lanthanum zirconate titanate family. The passivation layer is typically made from a dielectric material, such as SiO2, Si3N4, or polyimide, to serve as an electrical insulator and to protect the piezoelectric layer. It should be noted that the sacrificial layer 114 in a bridge-type BAW device is, in general, etched away in the final fabrication stages to create an air interface beneath the device. In a mirror-type BAW device, there is an acoustic mirror structure beneath the bottom electrode 120. The mirror structure consists of several layer pairs of high and low acoustic impedance materials, usually quarter-wave thick. The bridge-type and the mirror-type BAW devices are known in the art.

The desired electrical response in an FBAR-based device is achieved by a shear or longitudinal acoustic wave propagating in the vertical thickness through the device. Besides these wave modes, there exist other modes, including other shear modes, extensional modes and their higher harmonics. However, with respect to the operation point, the Lamb wave modes in the nearby frequencies are the unwanted spurious modes that may deteriorate the electrical response. In quartz crystals, the strength of these spurious modes is controlled by adjusting the thickness and the width of the top electrode. In an FBAR-based device, the dimension in thickness direction is so small that it renders thickness adjustment difficult and impractical. A possible solution to resolving the problems associated with the spurious modes is to thicken the edge of the top electrode. As disclosed in Kaitila et al. (WO 01/06647 A1, hereafter referred to as Kaitila), a frame-like structure 150 is formed on top of the top electrode 140 to thicken the edge thereof. As shown in FIGS. 1a and 1b, the frame-like structure 150 is a rectangular frame for defining a first zone and a second zone for acoustic wave excitation. The first zone is the area under the frame-like structure 150, and the second zone 148 is the area surrounded by the frame-like structure 150. With such a structure, the cut-off frequency of the piezoelectrically excited wave modes in the first zone and that in the second zone is different. When the width of the frame-like structure and the acoustic properties of the layer structure are properly arranged, the displacement relating to the strongest of the piezoelectrically excited resonance modes is substantially uniform in the second zone. The electrical response of an FBAR-based device with a thickened edge (solid line) and that without a thickened edge (dashed line) are presented on a Smith Chart as shown in FIG. 4.

As it is known in the art, a Smith Chart is a polar plot of the complex reflection, which represents the ratio of the complex amplitudes of the backward and forward waves. The Smith Chart helps translating the reflection coefficient into impedance, and it maps part of the impedance plane onto a unit circle. In an FBAR-based resonator, the piston mode is a vibration mode where the vibration amplitude is practically uniform over the second zone. If a resonator exhibits the piston mode, the spurious modes become very weakly excited and the response of the resonator is optimized with respect to the spurious resonances. In general, when the Smith Chart shows a clean circle, the structure of the resonator is close to a piston mode producing structure. Thus, the Smith Chart is a good indicator of the quality of the resonator response. In FIG. 4, the outermost circle that touches the square frame of the plot is the unit circle in the Smith Chart.

It should be noted that, as disclosed in Kaitila, the frame-like structure may be circular, square, polygonal, regular or irregular. Also, the frame-like structure can have different configurations, as shown in FIGS. 2 and 3, to achieve the piston mode. As shown in FIGS. 2 and 3, part of the piezoelectric layer 130 is covered by a passivation layer 160, and part of the passivation layer is sandwiched between the piezoelectric layer 130 and the frame-like structure 150 extended upward from the edge of the top electrode 140. In FIGS. 2 and 3, the frame-like structure 150 is basically where the top electrode 140 overlaps with the passivation layer 130. It should be noted that FIG. 1a is a cross sectional view of a BAW device, as viewed in the lateral direction, while FIG. 2 and FIG. 3 are cross sectional views of a BAW device, as viewed in the horizontal direction.

In FBAR-based ladder filters, the frequency of the shunt resonators must be down-shifted by adding an extra thin-film of a suitable material to the film stack of the resonator. The added thin-film is usually referred to as the tuning layer. The thickness of the tuning layer is determined by the desired frequency shift and is generally much smaller than the thickness of other layers on the device. If the shunt resonator in a ladder filter is designed to operate optimally, with regard to the suppression of the spurious mode without the tuning layer, adding the tuning layer may degrade the performance of the resonator by re-introducing the spurious resonance frequencies.

Thus, it is advantageous and desirable to provide a method of tuning the shunt resonator for frequency down-shifting without substantially degrading the performance of the shunt resonator.

SUMMARY OF THE INVENTION

It is a primary object of the present invention to provide a method for tuning a frequency down-shifted bulk acoustic wave device for reducing spurious resonance due to the frequency down-shifting, wherein a tuning layer formed on top of the top electrode of the bulk acoustic wave device is used to lower the resonant frequency of the device. This object can be achieved by configuring the tuning layer.

Thus, according to the first aspect of the present invention, a method of tuning a bulk acoustic wave device comprising a substrate and a plurality of acoustic wave generating and controlling layers formed on the substrate, wherein the acoustic wave generating and controlling layers include a piezoelectric layer formed between a first electrode and a second electrode for generating piezoelectrically excited acoustic signals, wherein the first electrode has a frame-like structure at an edge portion of the first electrode for reducing spurious resonance components in the acoustic waves, and the frame-like structure surrounds a center zone having a surface area, and wherein the device has a resonance frequency which can be down-shifted by modifying the first electrode. The method comprises the step of providing a tuning layer on top of the first electrode for modifying the first electrode such that the tuning layer covers at least the surface area of the center zone for reducing spurious resonance resulting from the tuning layer.

Alternatively, the tuning layer also covers at least part of the frame-like structure.

Preferably, the tuning layer substantially covers the entire frame-like structure.

According to the second aspect of the prevent invention, a bulk acoustic wave device comprising a substrate and a plurality of acoustic wave generating and controlling layers formed on the substrate, wherein the acoustic wave generating and controlling layers include a piezoelectric layer formed between a first electrode and a second electrode for generating piezoelectrically excited acoustic signals, wherein the first electrode has a frame-like structure at an edge portion of the first electrode for reducing spurious resonance components in the acoustic signals and the frame-like structure surrounds a center zone having a surface area, and wherein the device has a resonance frequency which can be down-shifted by modifying the first electrode. The device comprises a tuning layer provided on top of the first electrode for modifying the first electrode such that the tuning layer covers at least the surface area of the center zone, and alternatively, at least part of the frame-like structure as well as the surface area of the center zone. Preferably, the tuning layer substantially covers the entire frame-like structure as well as the surface area of the center zone.

The present invention will become apparent upon reading the description taken in conjunction with FIGS. 5 to 9.

BRIEF DESCRIPTION OF THE DRAWINGS

FIG. 1b is a top view of the bulk acoustic wave device as shown in FIG. 1a.

DETAILED DESCRIPTION

Figure 5:
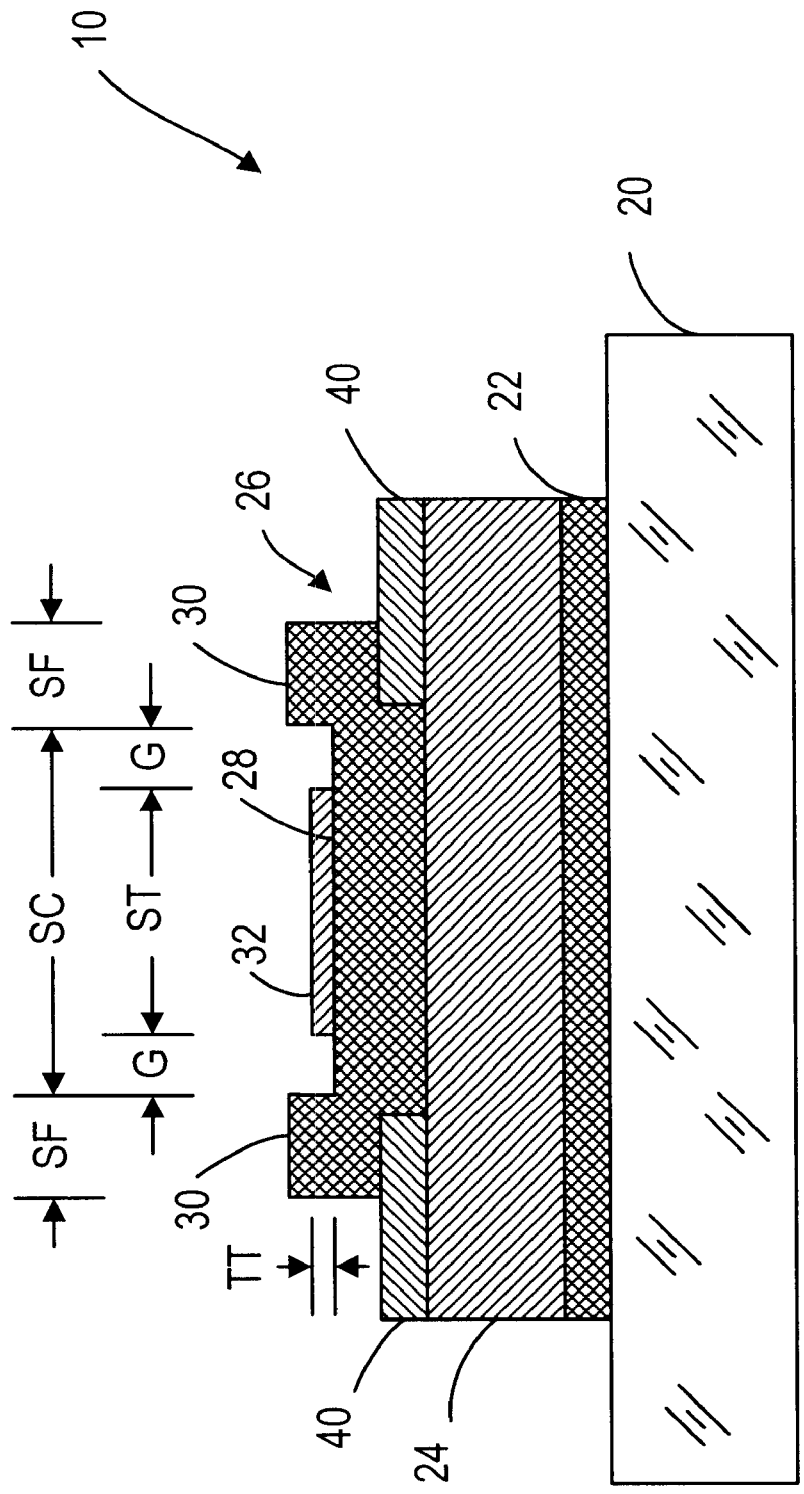
FIG. 5 is a cross sectional view showing a tuning layer used for frequency down-shifting a bulk acoustic wave device, wherein the surface area of the tuning layer is smaller than the surface area of the center zone.
Figure 7A:
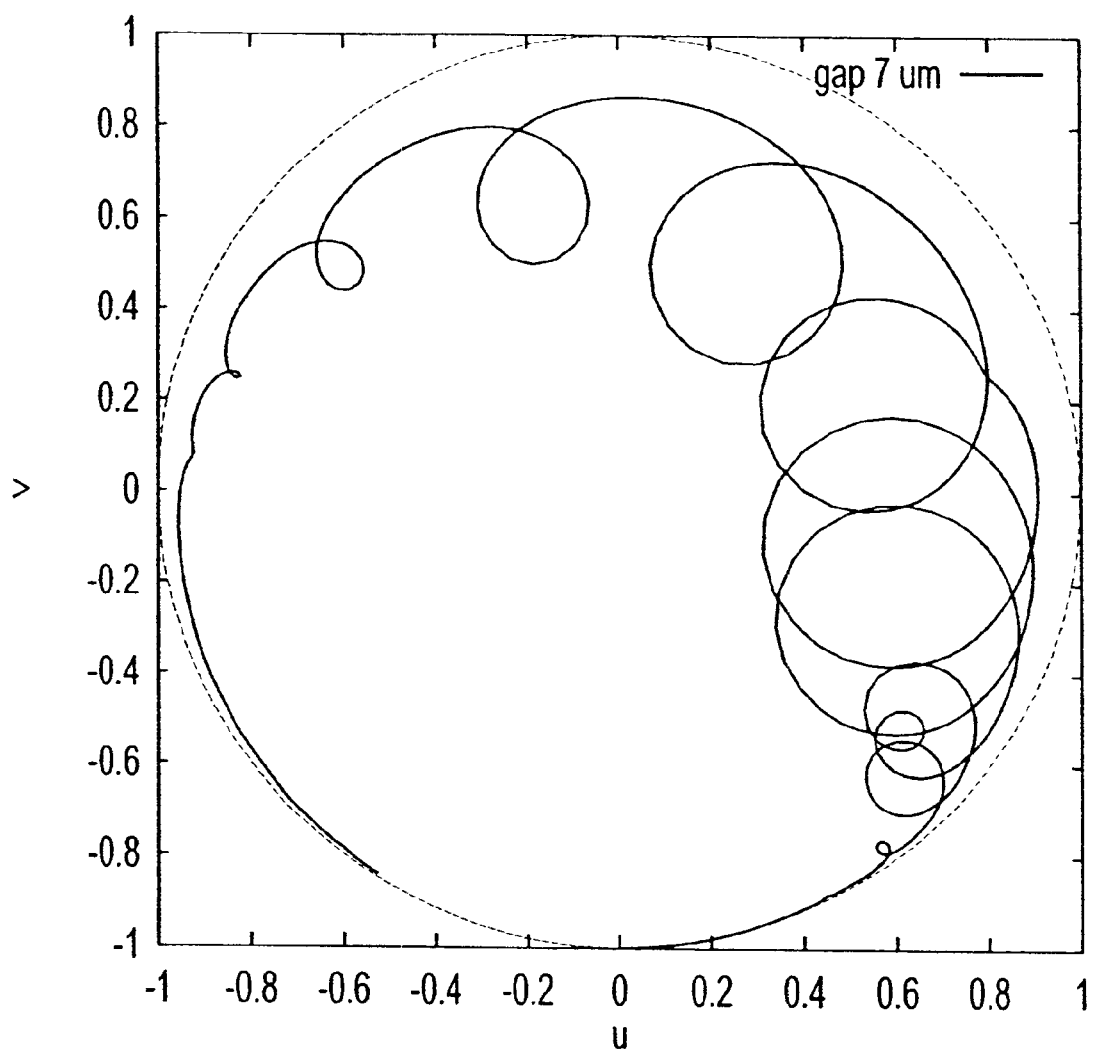
FIG. 7a is a Smith Chart showing the electrical response of a bulk acoustic wave device including spurious resonance components due to the tuning layer, wherein the gap between the tuning layer and the frame-like structure is about 2.4% of the entire width of the resonator.

FIG. 5 shows a bulk acoustic wave device 10 formed on a substrate 20 and having a piezoelectric layer 24 sandwiched between a bottom electrode 22 and a top electrode 26 for generating piezoelectrically excited acoustic signals. As shown in FIG. 5, the top electrode 26 has a frame-like structure 30 surrounding a center zone 28 for reducing spurious components in the acoustic signals. The surface area of the center zone 28, as surrounded by the frame-like structure 30, is denoted by SC. The surface area of the frame-like structure is denoted by SF. A tuning layer 32, having a thickness TT and a surface area ST, is provided on top of the top electrode 26 for down-shifting the frequency of the device 10. The thickness TT is related to the amount of frequency down-shifting. It has been found that, when the surface area ST of the tuning layer 32 is smaller than the surface area SC, leaving a gap G, the electrical response of the device 10 shows a substantial amount of spurious resonance, as shown in FIG. 7a. Thus, the addition of the tuning layer 32 on top of the top electrode 26 introduces spurious resonance components to the piezoelectrically excited acoustic signals. FIG. 7a shows the spurious resonance when the gap G between the tuning layer 32 and the frame-like structure 30 is about 2.4% of the width of the device.

Figure 6A:
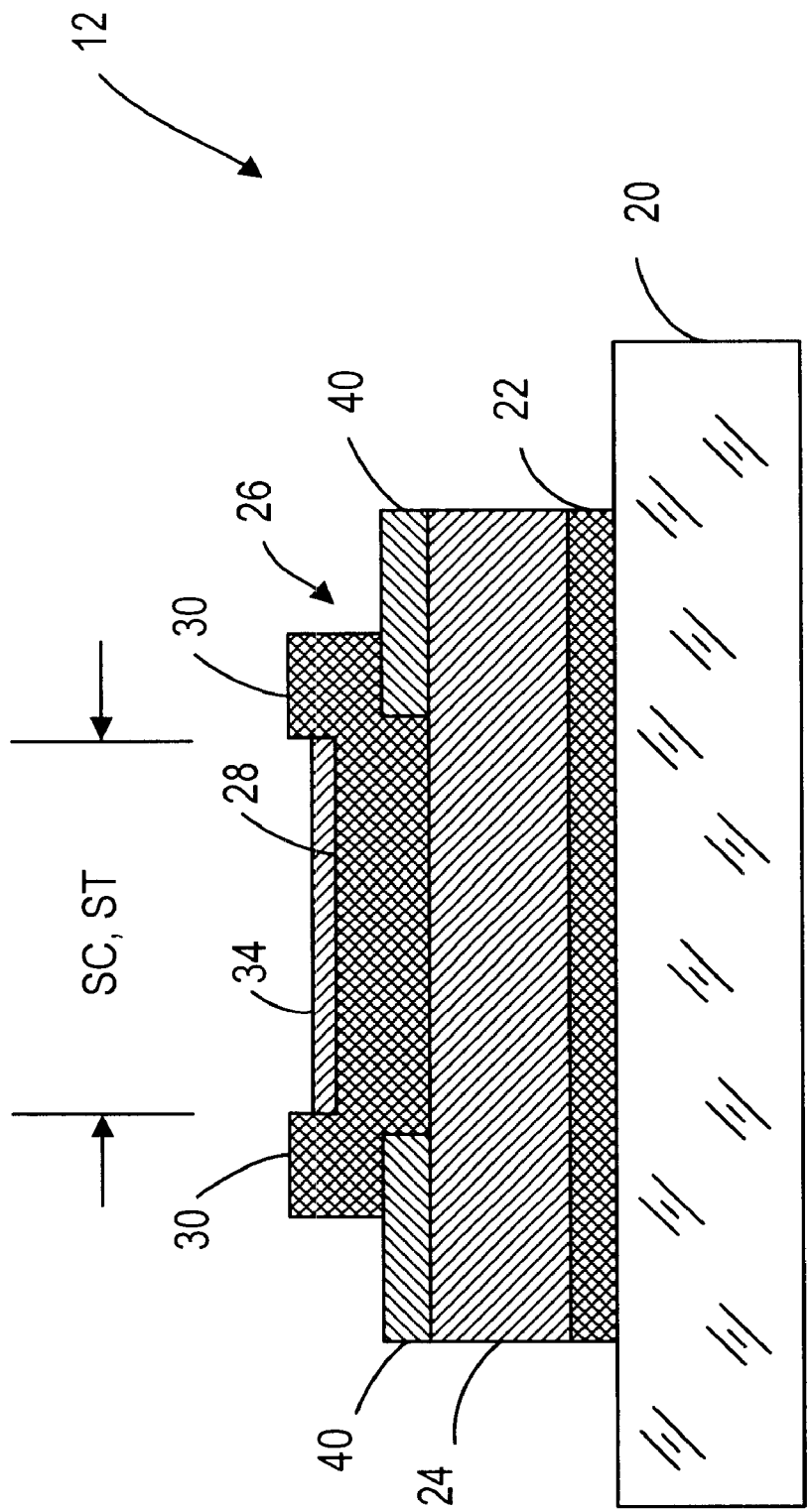
FIG. 6a is a cross sectional view showing a bulk acoustic wave device having a tuning layer, according to the present invention.
Figure 7B:
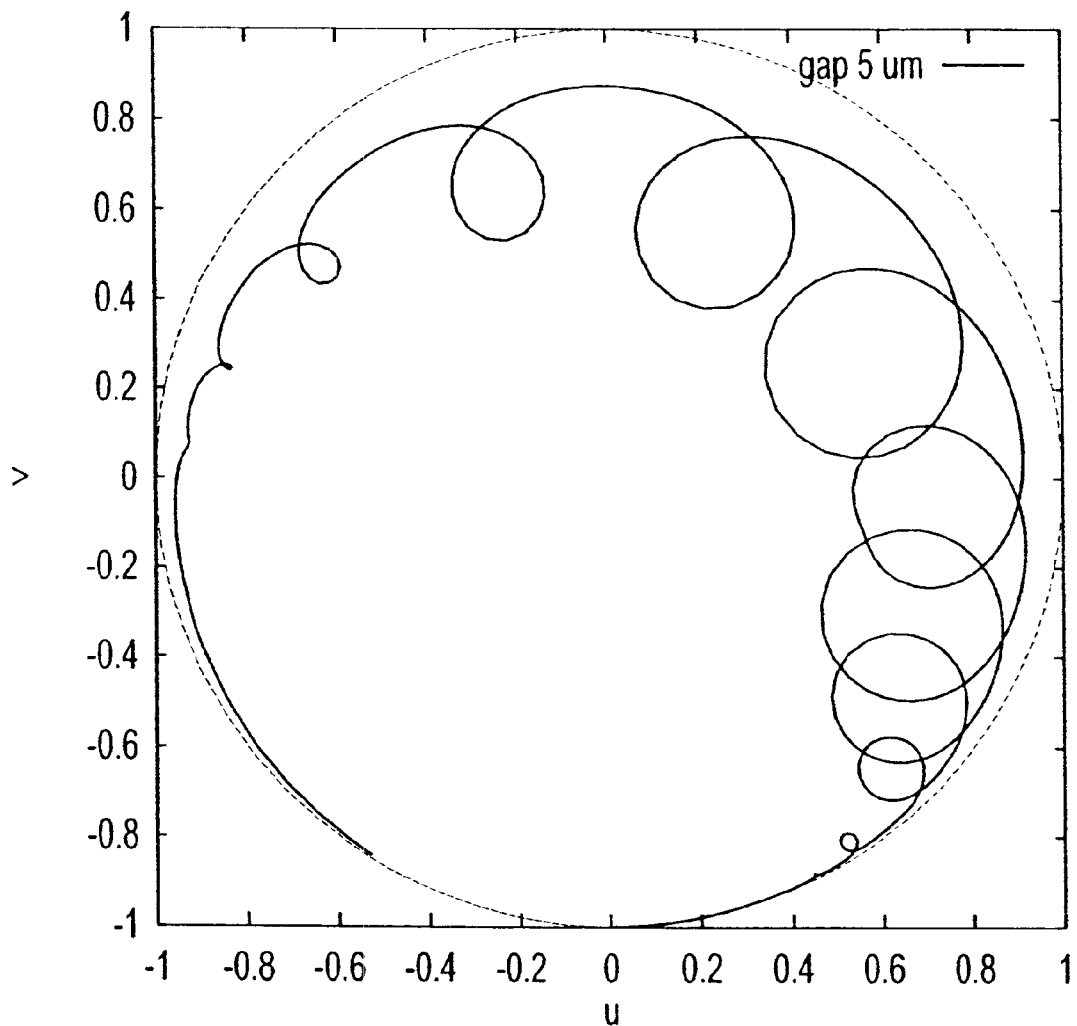
FIG. 7b is a Smith Chart showing the reduction of spurious resonance by extending the tuning layer toward the frame-like structure, such that the gap between the tuning layer and the frame-like structure is about 1.7% of the entire width of the resonator.
Figure 7C:
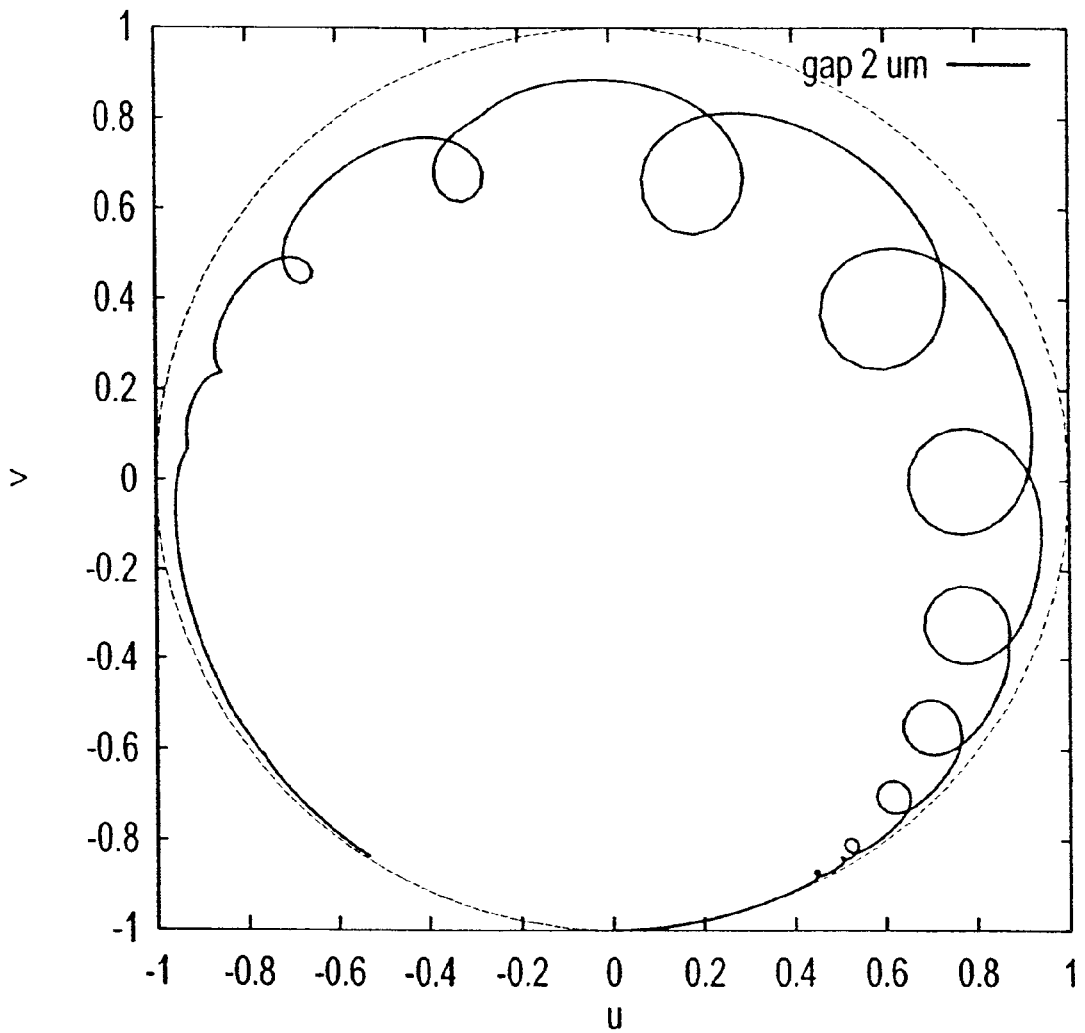
FIG. 7c is a Smith Chart showing the reduction of spurious resonance by further extending tuning layer toward the frame-like structure, such that the gap between the tuning layer and the frame-like structure is about 0.7% of the entire width of the resonator.
Figure 7D:
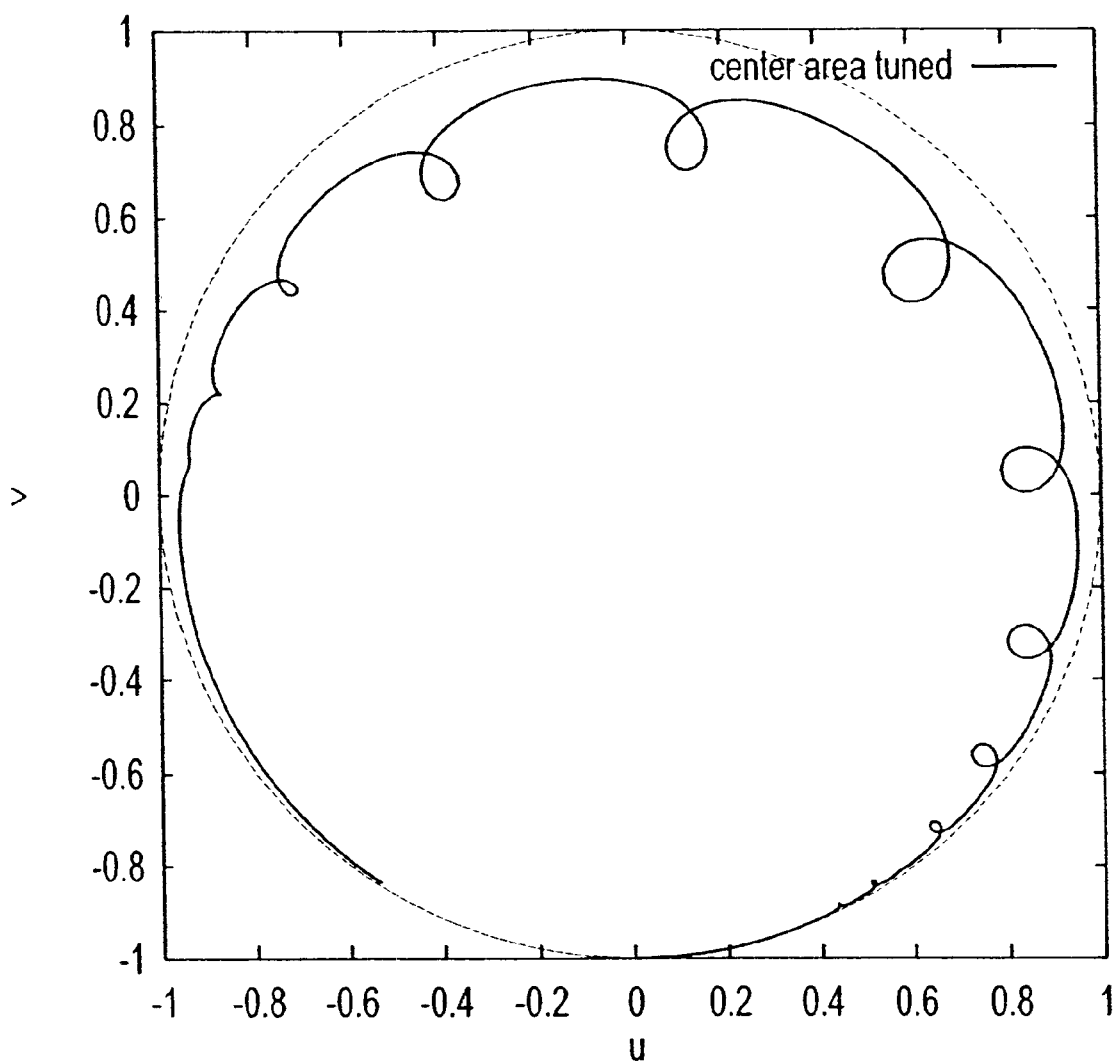
FIG. 7d is a Smith Chart showing the reduction of spurious resonance by further extending the tuning layer to cover the entire center area.

It has also been found that, when the gap G between the surface area of the center zone 28 and the surface area ST of the tuning layer 32 is reduced, the spurious resonance is also reduced. If the gap G between the tuning layer 32 and the frame-like structure 30 is reduced to about 1.7% of the width of the device, the amount of spurious resonance is somewhat reduced, as shown in FIG. 7b. If the gap G is further reduced to 0.7%, the electrical response is further improved, as shown in FIG. 7c. When the tuning layer 32 totally covers the entire surface area of the center zone 28, as shown in FIG. 6a, the resulting Smith Chart is as shown in FIG. 7d.

Figure 6B:
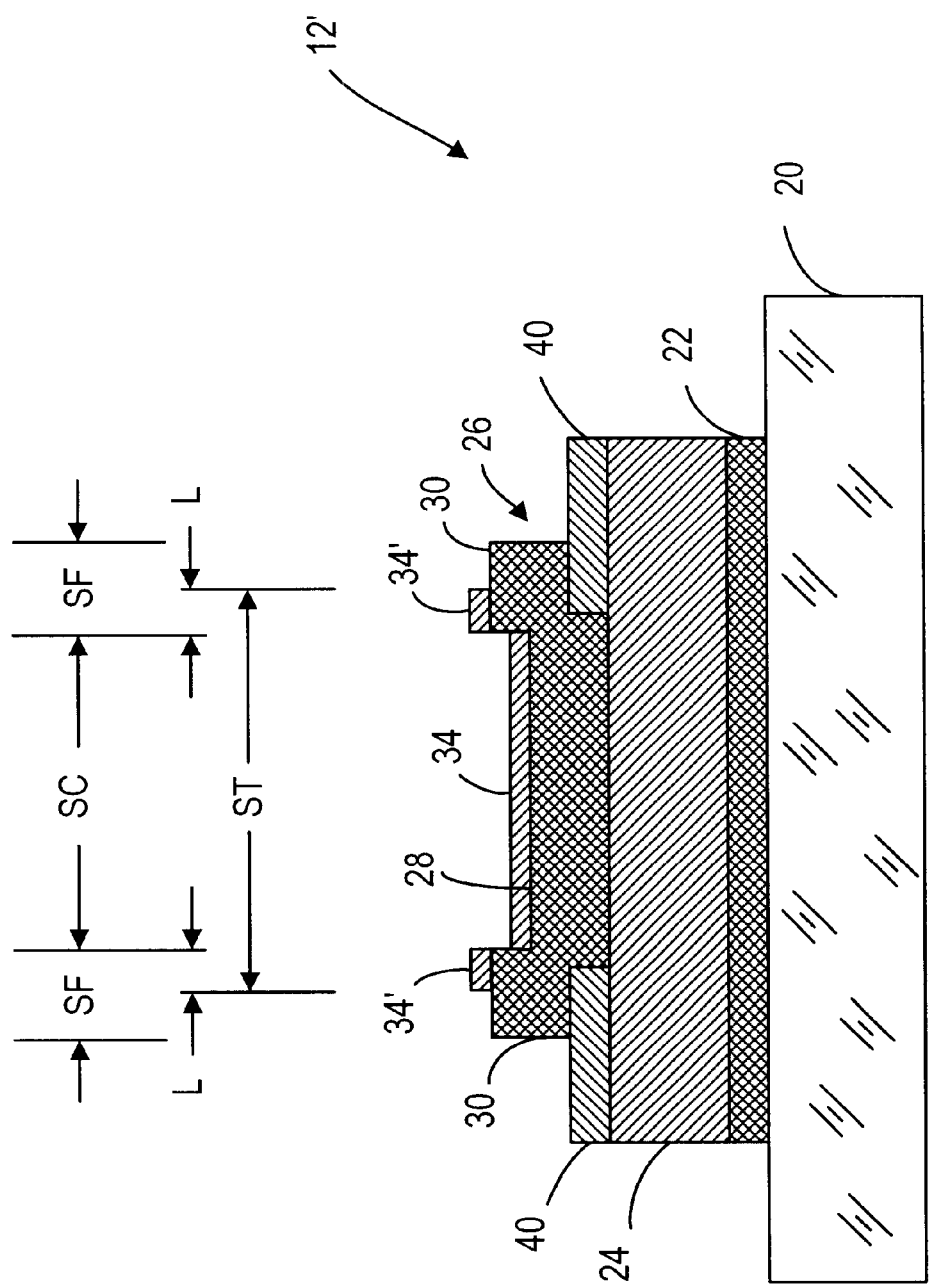
FIG. 6b is a cross sectional view showing a bulk acoustic wave device having a tuning layer, according to another embodiment of the present invention.
Figure 6C:
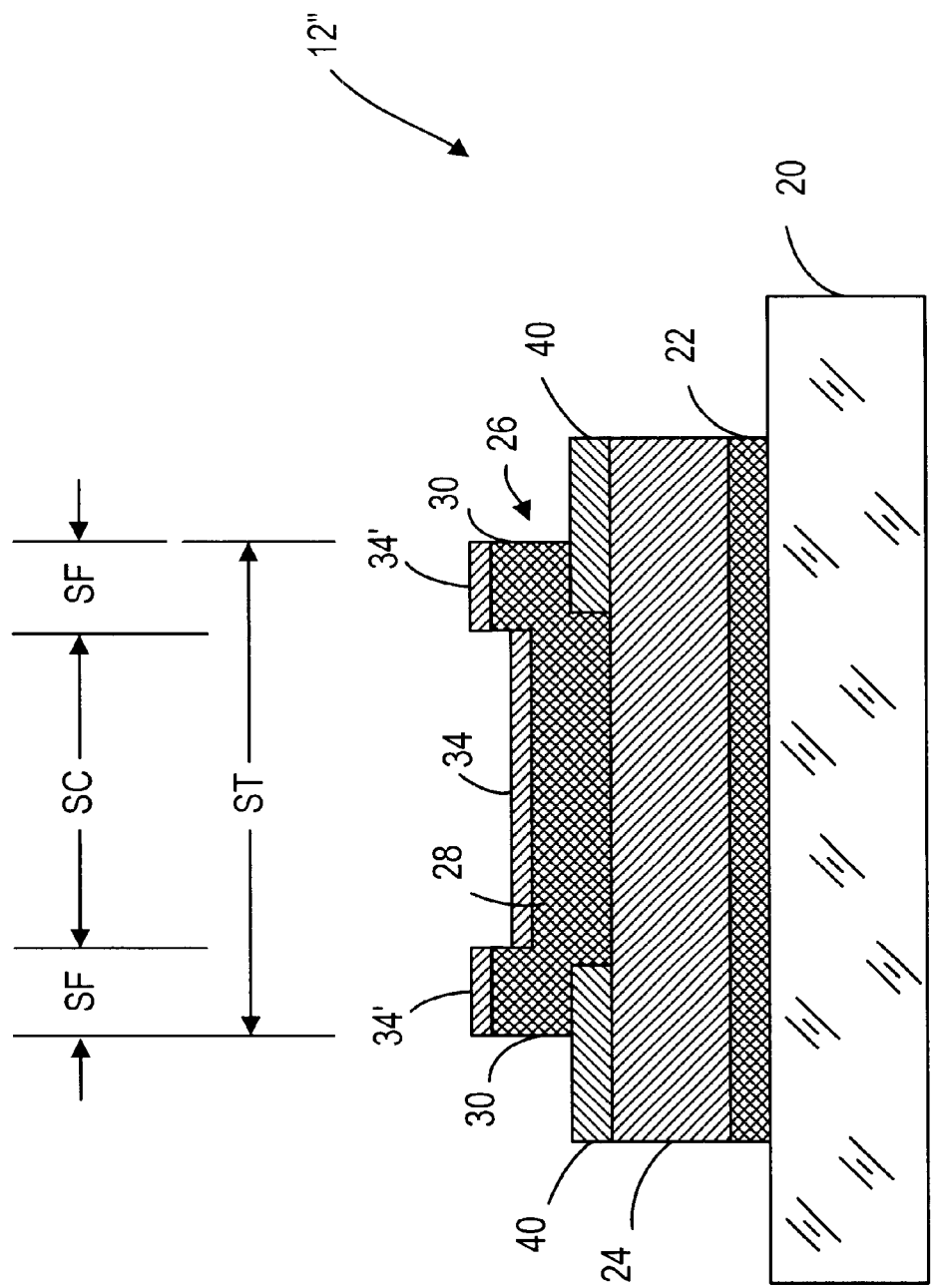
FIG. 6c is a cross sectional view showing a bulk acoustic wave device having a tuning layer, according to the preferred embodiment of the present invention.
Figure 7E:
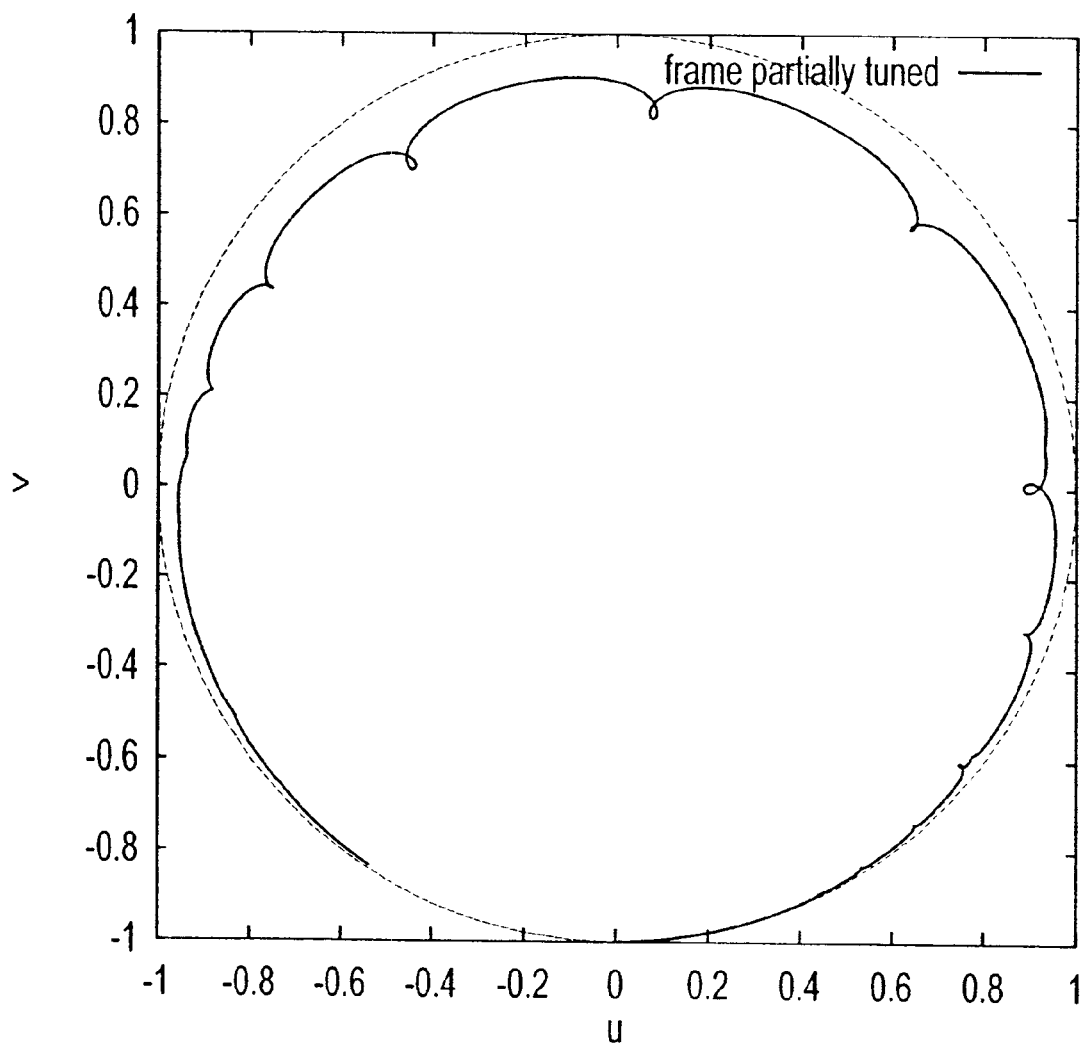
FIG. 7e is a Smith Chart showing the reduction of spurious resonance by extending the tuning layer to cover part of the frame-like structure.
Figure 7F:
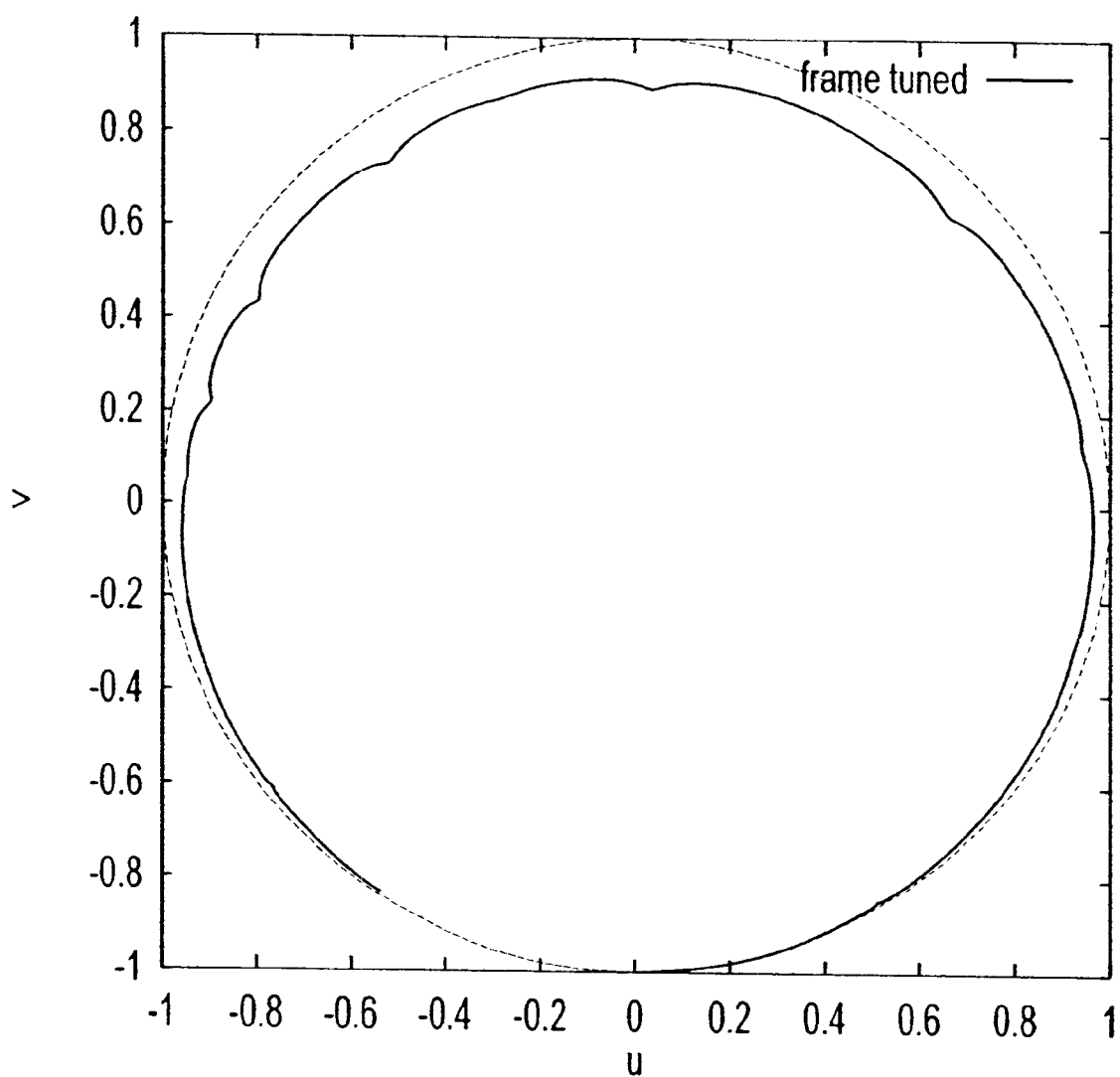
FIG. 7f is a Smith Chart showing the reduction of spurious resonance by extending the tuning layer to cover the entire frame-like structure.

Furthermore, it has been found that if the tuning layer 34 is extended further to cover the surface area SF of the frame-like structure 30, as shown in FIG. 6b, the spurious resonance in the electrical response can be further reduced, as shown in FIG. 7e. In FIG. 6b, the bulk acoustic wave device 12' has a tuning layer 34 which has an extended section 34' to overlap partially with the frame-like structure 30. The overlapped width of the extended section 34' is denoted by letter L. When the overlapped width L is increased to cover the entire surface area of the frame-like structure 30, as shown in FIG. 6c, the spurious resonance becomes insignificant. The device 12", as shown in FIG. 6c, represents one form of the preferred embodiment of the present invention. Other forms of the preferred embodiment of the present invention are shown in FIGS. 8a and 8b.

Figure 8A:
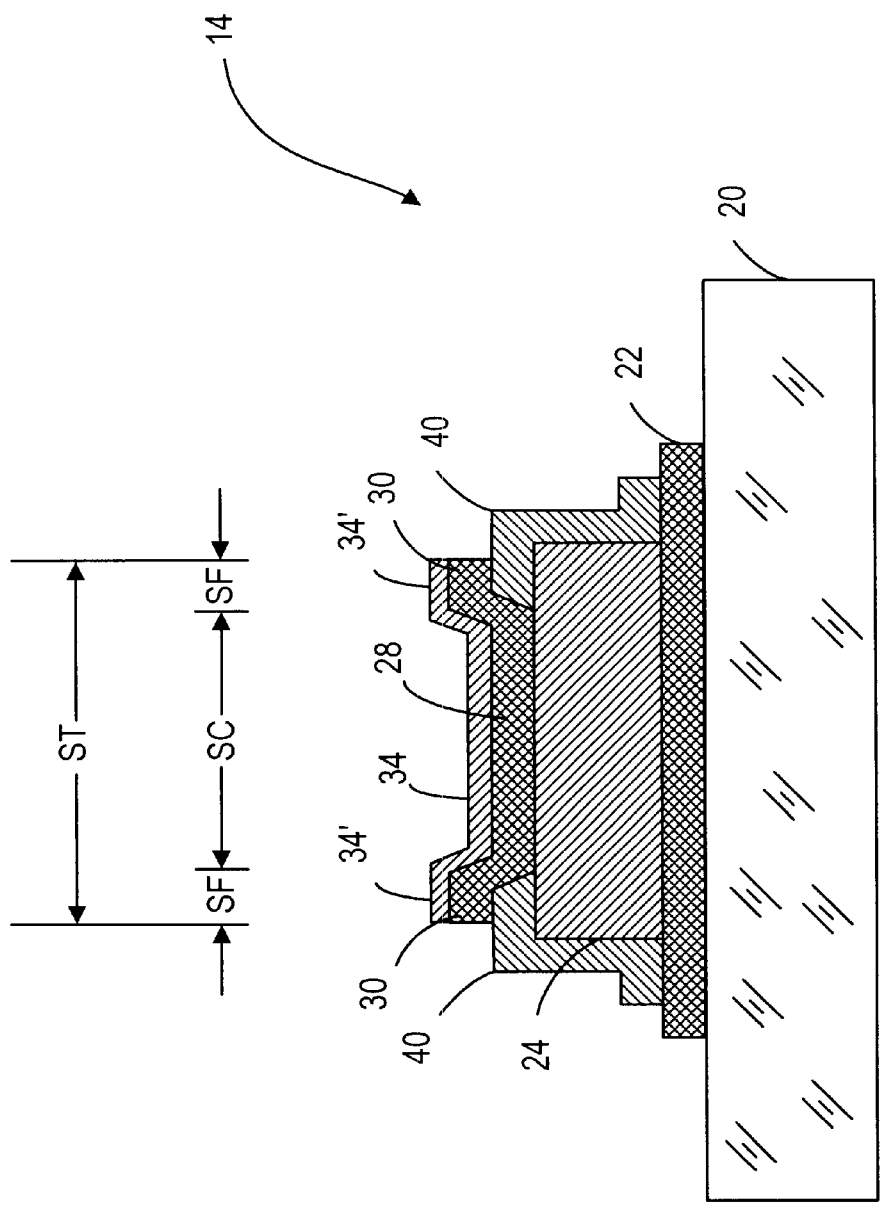
FIG. 8a is a cross sectional view showing a variation of the preferred embodiment of the present invention.
Figure 8B:
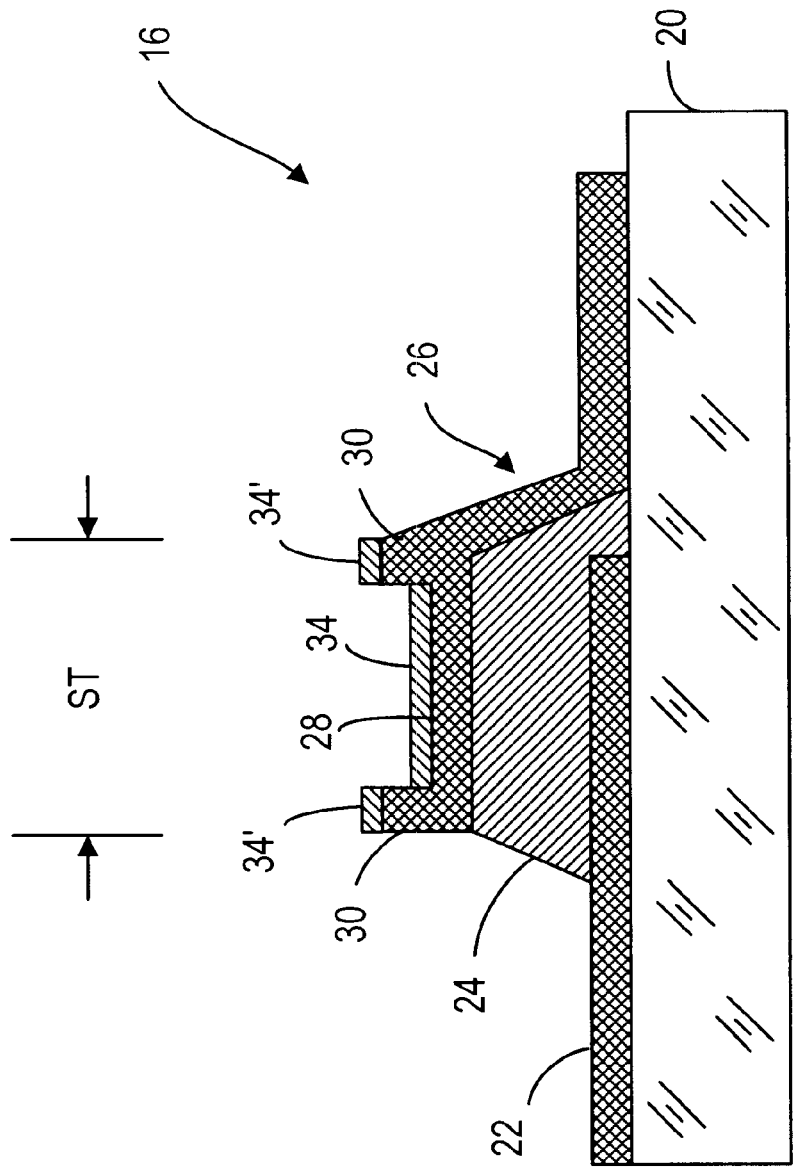
FIG. 8b is a cross sectional view showing yet another variation of the preferred embodiment of the present invention.

In the bulk acoustic wave device 14, as shown in FIG. 8a, the transition from the center zone 28 to the frame-like structure 30 of the top electrode 26 is less abrupt than that in the device 12", as shown in FIG. 6c. Accordingly, the transition from the tuning layer 34 to the extended section 34' is less abrupt than its counterpart on the device 12", as shown in FIG. 6c. In FIG. 8b, the frame-like structure 30 is a thickened edge of the top electrode 26. Accordingly, the extended section 34' is formed on top of the thickened edge 30.

The method of reducing spurious resonance in the electrical response due to frequency down-shifting, according to the present invention, has been described in conjunction with a number of simple bulk acoustic wave devices as illustrated in FIGS. 6a, 6b, 6c, 8a and 8b. In those devices, there are only three acoustic-wave generating and controlling layers, namely, the top electrode, the piezoelectric layer and the bottom electrode. The same method can also be used on more complex bulk acoustic wave devices having additional acoustic-wave generating and controlling layers. Also, the tuning layer as described in conjunction with FIGS. 6a–6c, 8a and 8b is concerned with the top electrode of a BAW device. It is possible, however, that the tuning layer is positioned below the piezoelectric layer or below the bottom electrode. In either case, the tuning layer should laterally extend over all of the center area and most of the frame-like structure area. Furthermore, if the tuning layer is positioned between the piezoelectric layer and the bottom electrode, it is preferred to use an electrically conductive tuning layer so that the tuning layer forms part of the bottom electrode.

It should be noted that the tuning layer can be made from the same material as the top electrode, but it can also be made from a different material. For example, if the top electrode is made of aluminum, then the tuning layer can be made of aluminum, molybdenum, tungsten, copper, gold or other electrically conductive material. Furthermore, the tuning layer can be made of a non-electrically conductive material such as $SiO_2$, $Si_3N_4$, and the like. The critical points in selecting the tuning material are the etch selectivity against other layers for the patterning process and the ability to accurately deposit the correct thickness of the tuning layer. In general, it is preferable to use a lighter material for the tuning layer because a thicker layer would be needed for the same frequency shift. Precise deposition of a thinner layer is generally more difficult than that of a thicker layer.

Figure 1A:
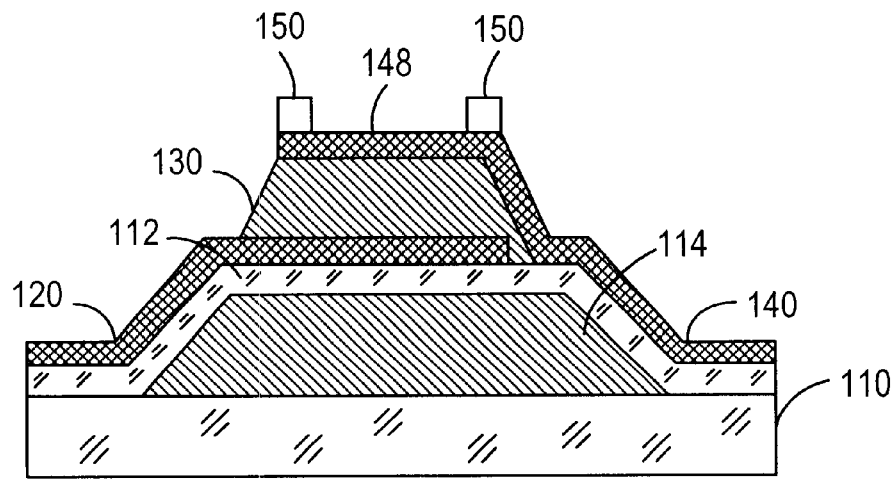
FIG. 1a is a cross sectional view illustrating a bulk acoustic wave device having a top electrode with a thickened edge or frame-like structure provided thereon for reducing spurious resonance.
Figure 1B:
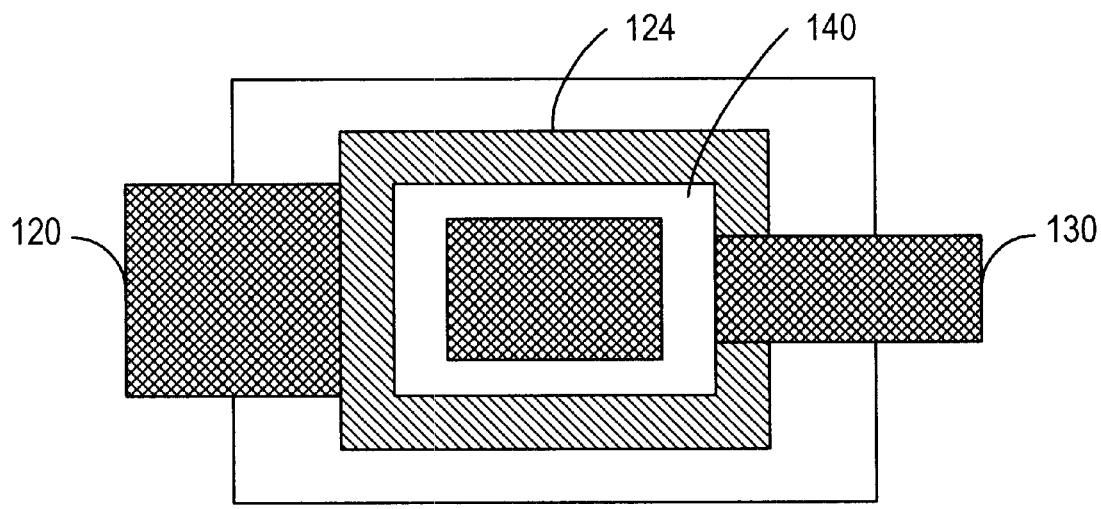
Figure 2:
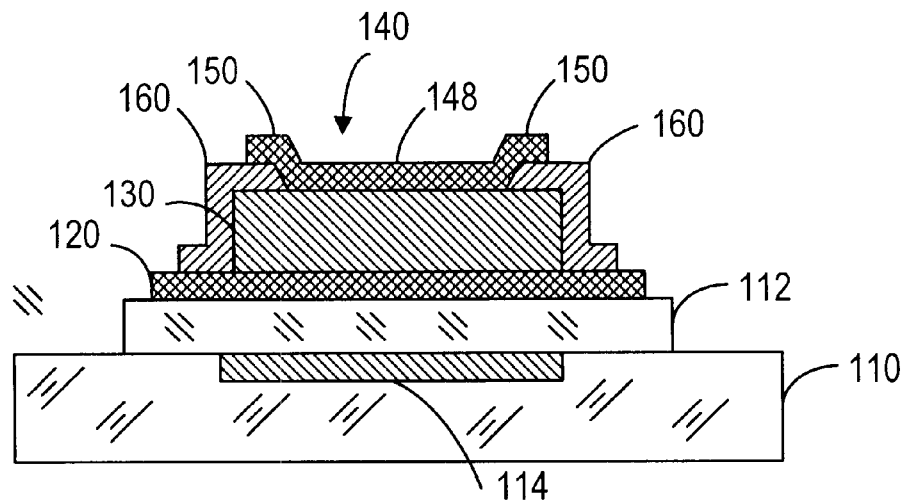
FIG. 2 is a cross sectional view illustrating another bulk acoustic wave device having a frame-like structure on top of the top electrode.
Figure 3:
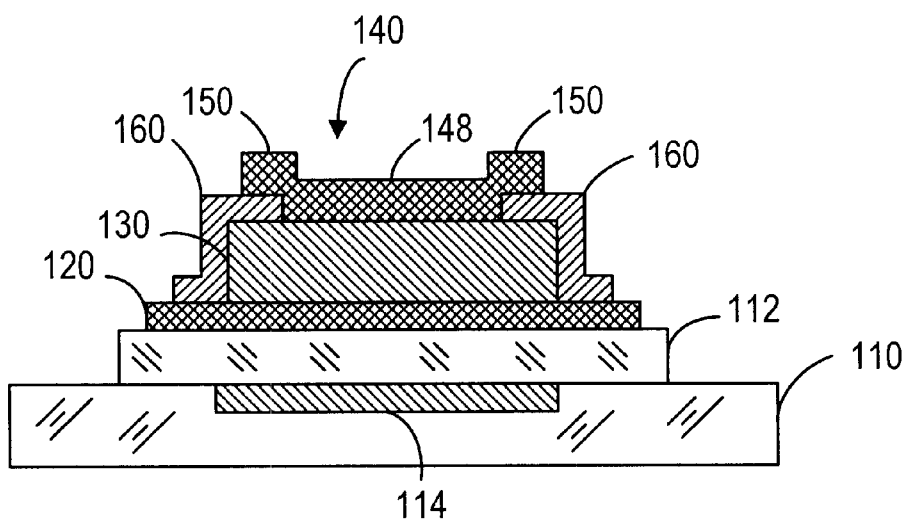
FIG. 3 is a cross sectional view illustrating yet another bulk acoustic wave device havina frame-like structure on top of the top electrode.
Figure 4:
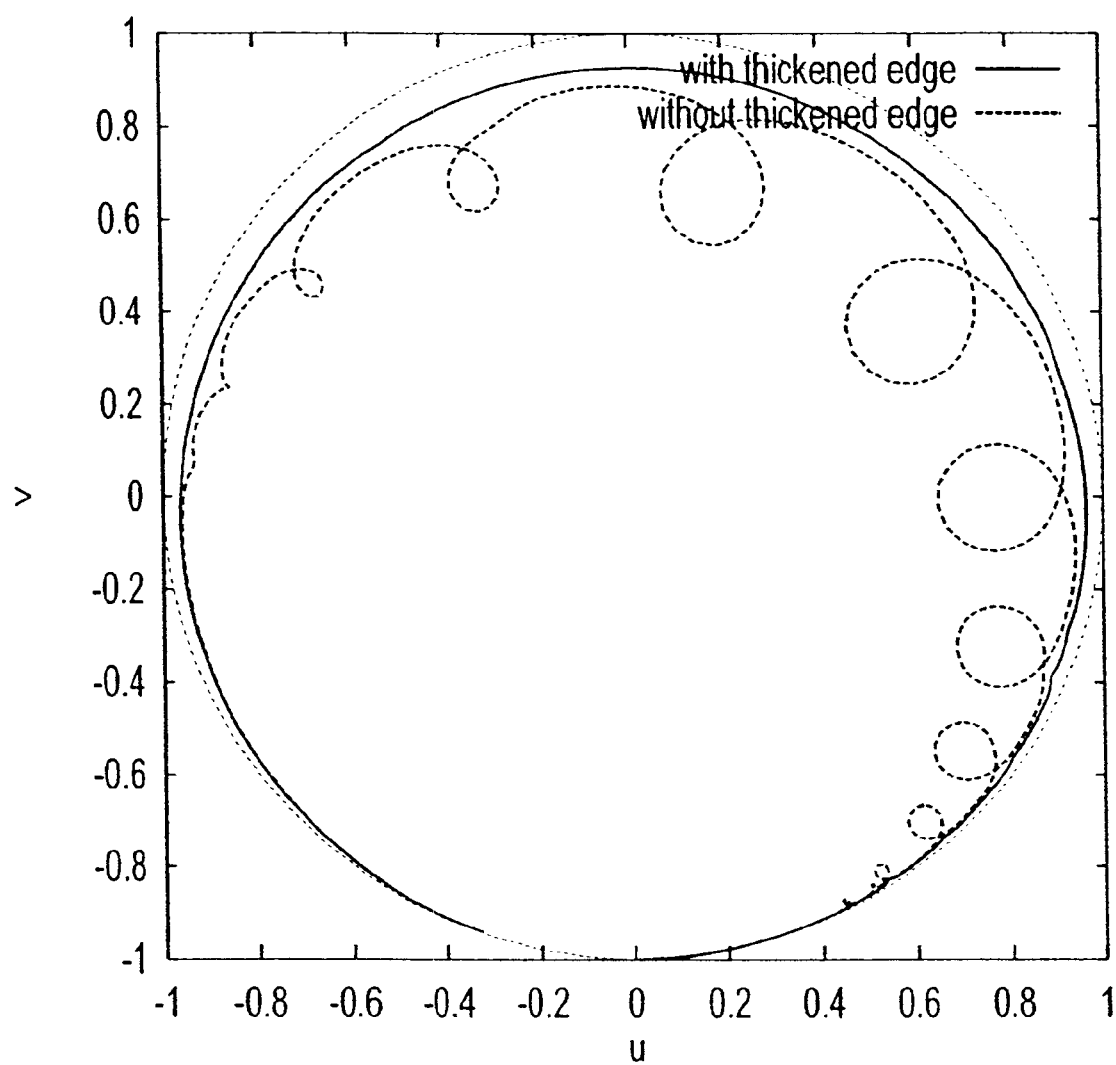
FIG. 4 is a Smith Chart showing the effect of the frame-like structure on the electrical response of the bulk acoustic wave device.
Figure 9:
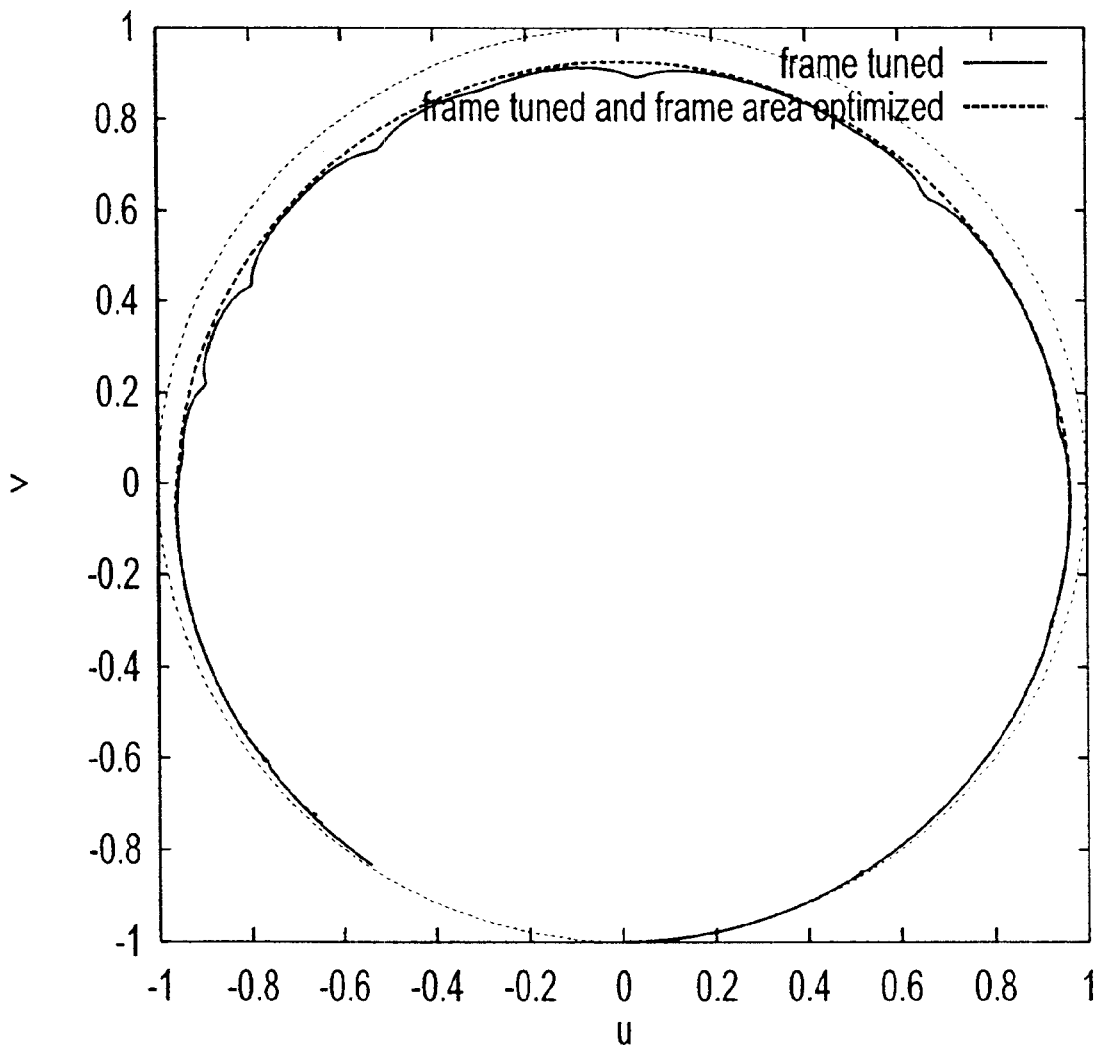
FIG. 9 is a Smith Chart showing the electrical response of a frame-tuned resonator where the frame-like structure in shunt resonators is designed such that a tuning layer is considered as part of the resonators, and the electrical response of an optimally tuned resonator.

Furthermore, when the tuning layer 34' and the top electrode 30 are made of the same material, as shown in FIGS. 6c and 8a, together they appear to be the same as the top electrode 140, as shown in FIGS. 2 and 3. Thus, it is possible to design a top electrode that includes a tuning layer as part of the BAW device in the first place. In a device that consists of series and shunt resonators, the shunt resonators always require some kind of tuning. Thus, the frame-like area of the shunt resonators could be different from that of the series resonators. Accordingly, the frame-like area of the tuned resonators could also be different from that of the series resonators. It should be noted that the dimensions of the frame-like structure on the top electrode, according to Kaitila, are calculated based on a set of boundary conditions. If the frame-like structure in shunt resonators is designed according to Kaitila and considering the tuning layer as a part of the resonator in the first place, the dimension of the frame-like structure in these frame-tuned resonators would be slightly different from the frame-like structure that reproduces the piston mode. The electrical response of a frame-tuned resonator (solid line) is shown in FIG. 9. The non-circularity is about 0.11%. In order to optimize the performance of the shunt resonator, the width of the frame-like structure can be modified to reproduce the piston mode (dashed line), as shown in FIG. 9.

It should be noted that the bulk acoustic wave devices, according to the present invention, include individual resonators, stacked crystal filters, ladder filters and the combinations thereof. However, there are other filter types in addition to the ladder structure that can be constructed from FBARs. All of them include some resonators, which have to be tuned, but they cannot be called parallel or shunt resonators in all cases. The balanced filter is an example of such a filter type.

Thus, although the invention has been described with respect to a preferred embodiment thereof, it will be understood by those skilled in the art that the foregoing and various other changes, omissions and deviations in the form and detail thereof may be made without departing from the spirit and scope of this invention.

What is claimed is:

1. A method of tuning a bulk acoustic wave device comprising a substrate and a plurality of acoustic wave generating and controlling layers formed on the substrate, wherein the acoustic wave generating and controlling layers include a piezoelectric layer formed between a first electrode and a second electrode for generating piezoelectrically excited acoustic signals, wherein the first electrode has a frame-like structure at an edge portion of the first electrode for reducing spurious resonance components in the acoustic waves, and the frame-like structure surrounds a center zone having a surface area, and wherein the device has a resonance frequency which can be down-shifted by modifying the first electrode, said method comprises the step of providing a tuning layer on top of the first electrode for modifying the first electrode such that the tuning layer covers at least the surface area of the center zone for reducing spurious resonance resulting from the tuning layer, wherein said tuning layer covers at least part of the frame-like structure.

2. A method of tuning a bulk acoustic wave device comprising a substrate and a plurality of acoustic wave generating and controlling layers formed on the substrate, wherein the acoustic wave generating and controlling layers include a piezoelectric layer formed between a first electrode and a second electrode for generating piezoelectrically excited acoustic signals, wherein the first electrode has a frame-like structure at an edge portion of the first electrode for reducing spurious resonance components in the acoustic waves, and the frame-like structure surrounds a center zone having a surface area, and wherein the device has a resonance frequency which can be down-shifted by modifying the first electrode, said method comprises the step of providing a tuning layer on top of the first electrode for modifying the first electrode such that the tuning layer covers at least the surface area of the center zone for reducing spurious resonance resulting from the tuning layer, wherein said tuning layer covers substantially all of the frame-like structure.

3. The method of claim 1, wherein the first electrode is made from a first material, and said tuning layer is made from a second material different from the first material.

4. The method of claim 1, wherein the first electrode and said tuning layer are made from the same material.

5. The method of claim 1, wherein the tuning layer is made from an electrically conducting material.

6. The method of claim 1, wherein the tuning layer is made from an electrically non-conducting material.

7. A bulk acoustic wave device comprising a substrate and a plurality of acoustic wave generating and controlling layers formed on the substrate, wherein the acoustic wave generating and controlling layers include a piezoelectric layer formed between a first electrode and a second electrode for generating piezoelectrically excited acoustic signals, wherein the first electrode has a frame-like structure at an edge portion of the first electrode for reducing spurious resonance components in the acoustic signals and the frame-like structure surrounds a center zone having a surface area, and wherein the device has a resonance frequency which can be down-shifted by modifying the first electrode, said device comprising a tuning layer provided on top of the first electrode for modifying the first electrode such that the tuning layer covers at least the surface area of the center zone, wherein said tuning layer covers at least part of the frame-like structure as well as the surface area of the center zone.

8. A bulk acoustic wave device comprising a substrate and a plurality of acoustic wave generating and controlling layers formed on the substrate, wherein the acoustic wave generating and controlling layers include a piezoelectric layer formed between a first electrode and a second electrode for generating piezoelectrically excited acoustic signals, wherein the first electrode has a frame-like structure at an edge portion of the first electrode for reducing spurious resonance components in the acoustic signals and the frame-like structure surrounds a center zone having a surface area, and wherein the device has a resonance frequency which can be down-shifted by modifying the first electrode, said device comprising a tuning layer provided on top of the first electrode for modifying the first electrode such that the tuning layer covers at least the surface area of the center zone, wherein said tuning layer covers substantially all of the frame-like structure as well as the surface area of the center zone.

9. The device of claim 7, further comprising a passivation layer covering part of the piezoelectric layer for protecting said device, wherein at least part of the passivation layer is formed between the piezolectric layer and the frame-like structure, and wherein the frame-like structure is formed between said at least part of the passivation layer and said tuning layer.

* * * * *